US009581973B1

(12) United States Patent
Goyal et al.

(10) Patent No.: US 9,581,973 B1
(45) Date of Patent: Feb. 28, 2017

(54) DUAL MODE CLOCK USING A COMMON RESONATOR AND ASSOCIATED METHOD OF USE

(71) Applicant: Integrated Device Technology, Inc., San Jose, CA (US)

(72) Inventors: Pankaj Goyal, Sunnyvale, CA (US); Jagdeep Bal, Saratoga, CA (US); Stephen E. Aycock, Napa, CA (US)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/083,831

(22) Filed: Mar. 29, 2016

(51) Int. Cl.
*G04F 5/04* (2006.01)
*H03B 5/32* (2006.01)
*H03K 5/15* (2006.01)

(52) U.S. Cl.
CPC ............... *G04F 5/04* (2013.01); *H03B 5/32* (2013.01); *H03K 5/15006* (2013.01); *H03B 2200/0082* (2013.01)

(58) Field of Classification Search
CPC ..... G04F 5/00; G04F 5/04; G04F 5/06; G04F 5/10; H03B 2200/0082; H03B 5/30; H03B 5/32; H03B 5/36; H03B 5/364; H03B 5/366; H03K 5/15; H03K 5/15006
USPC ........................................ 327/291, 293, 295
See application file for complete search history.

(56) References Cited

U.S. PATENT DOCUMENTS

| 4,862,485 A | 8/1989 | Guinea et al. |
| 5,663,105 A | 9/1997 | Sua et al. |
| 5,748,949 A | 5/1998 | Johnston |
| 5,757,240 A | 5/1998 | Boerstler et al. |
| 5,903,195 A | 5/1999 | Lukes et al. |
| 6,219,797 B1 | 4/2001 | Liu et al. |
| 6,259,327 B1 | 7/2001 | Balistreri et al. |
| 6,640,311 B1 | 10/2003 | Knowles |
| 6,643,787 B1 | 11/2003 | Zerbe et al. |
| 6,650,193 B2 | 11/2003 | Endo et al. |
| 6,683,506 B2 | 1/2004 | Ye et al. |
| 6,727,767 B2 | 4/2004 | Takada |
| 6,768,387 B1 | 7/2004 | Masuda et al. |

(Continued)

OTHER PUBLICATIONS

"19-Output PCIE Gen 3 Buffer", Si53019-A01A, Silicon Laboratories Inc., Rev. 1.1 May 2015, 34 Pages.

(Continued)

*Primary Examiner* — William Hernandez
(74) *Attorney, Agent, or Firm* — Glass & Associates; Kenneth Glass; Molly Sauter

(57) ABSTRACT

An integrated circuit comprising, a resonator, a first clock circuit for generating a first clock signal having a first frequency in response to the resonator, a second clock circuit for generating a second clock signal having a second frequency in response to the resonator, wherein the second frequency of the second clock signal is determined by the programmable frequency divider and a clock mode control circuit coupled to the first clock circuit and the second clock circuit, the clock mode control circuit for gradually switching the resonator between the first oscillator circuit and the second oscillator circuit of the integrated circuit, using a shift register based state machine and utilizing the inertia of the resonator to smoothly transition between the two oscillators, to provide a dual mode clock output signal.

20 Claims, 8 Drawing Sheets

(56) References Cited

U.S. PATENT DOCUMENTS

| | | |
|---|---|---|
| 6,870,411 B2 | 3/2005 | Shibahara et al. |
| 6,959,066 B2 | 10/2005 | Wang et al. |
| 7,012,476 B2 | 3/2006 | Ogiso |
| 7,323,916 B1 | 1/2008 | Sidiropoulos et al. |
| 7,405,594 B1 | 7/2008 | Xu |
| 7,434,083 B1 | 10/2008 | Wilson |
| 7,541,848 B1 | 6/2009 | Masuda |
| 7,545,188 B1 | 6/2009 | Xu et al. |
| 7,573,303 B1 | 8/2009 | Chi et al. |
| 7,586,347 B1 | 9/2009 | Ren et al. |
| 7,590,163 B1 | 9/2009 | Miller et al. |
| 7,671,635 B2 | 3/2010 | Fan et al. |
| 7,737,739 B1 | 6/2010 | Bi |
| 7,741,981 B1 | 6/2010 | Wan et al. |
| 7,750,618 B1 | 7/2010 | Fang et al. |
| 7,786,763 B1 | 8/2010 | Bal et al. |
| 7,816,959 B1 | 10/2010 | Isik |
| 7,907,625 B1 | 3/2011 | MacAdam |
| 7,928,880 B2 | 4/2011 | Tsukamoto |
| 7,941,723 B1 | 5/2011 | Lien et al. |
| 8,018,289 B1 | 9/2011 | Hu et al. |
| 8,164,367 B1 | 4/2012 | Bal et al. |
| 8,179,952 B2 | 5/2012 | Thurston et al. |
| 8,188,796 B2 | 5/2012 | Zhu et al. |
| 8,259,888 B2 | 9/2012 | Hua et al. |
| 8,284,816 B1 | 10/2012 | Clementi |
| 8,305,154 B1 | 11/2012 | Kubena et al. |
| 8,416,107 B1 | 4/2013 | Wan et al. |
| 8,432,231 B2 | 4/2013 | Nelson et al. |
| 8,436,677 B2 | 5/2013 | Kull et al. |
| 8,456,155 B2 | 6/2013 | Tamura et al. |
| 8,471,751 B2 | 6/2013 | Wang |
| 8,537,952 B1 | 9/2013 | Arora |
| 8,693,557 B1 | 4/2014 | Zhang et al. |
| 8,704,564 B2 | 4/2014 | Hasegawa et al. |
| 8,723,573 B1 | 5/2014 | Wang et al. |
| 8,791,763 B2 | 7/2014 | Taghivand |
| 8,896,476 B2 | 11/2014 | Harpe |
| 8,933,830 B1 | 1/2015 | Jeon |
| 8,981,858 B1 | 3/2015 | Grivna et al. |
| 9,077,386 B1 | 7/2015 | Holden et al. |
| 9,100,232 B1 | 8/2015 | Hormati et al. |
| 9,455,854 B2 | 9/2016 | Gao et al. |
| 2002/0079937 A1 | 6/2002 | Xanthopoulos |
| 2002/0191727 A1 | 12/2002 | Staszewski et al. |
| 2003/0042985 A1 | 3/2003 | Shibahara et al. |
| 2003/0184350 A1 | 10/2003 | Wang et al. |
| 2004/0136440 A1 | 7/2004 | Miyata et al. |
| 2004/0165691 A1 | 8/2004 | Rana |
| 2006/0103436 A1* | 5/2006 | Saitou .................. H03K 3/0307 327/142 |
| 2006/0119402 A1 | 6/2006 | Thomsen et al. |
| 2006/0197614 A1 | 9/2006 | Roubadia et al. |
| 2006/0290391 A1 | 12/2006 | Leung et al. |
| 2007/0149144 A1 | 6/2007 | Beyer et al. |
| 2007/0247248 A1 | 10/2007 | Kobayashi et al. |
| 2008/0043893 A1 | 2/2008 | Nagaraj et al. |
| 2008/0104435 A1 | 5/2008 | Pernia et al. |
| 2008/0129351 A1 | 6/2008 | Chawla |
| 2008/0246546 A1 | 10/2008 | Ha et al. |
| 2009/0083567 A1 | 3/2009 | Kim et al. |
| 2009/0140896 A1 | 6/2009 | Adduci et al. |
| 2009/0153252 A1 | 6/2009 | Chen et al. |
| 2009/0184857 A1 | 7/2009 | Furuta et al. |
| 2009/0231901 A1 | 9/2009 | Kim |
| 2009/0256601 A1 | 10/2009 | Zhang et al. |
| 2009/0262567 A1 | 10/2009 | Shin et al. |
| 2010/0007427 A1 | 1/2010 | Tomita et al. |
| 2010/0052798 A1 | 3/2010 | Hirai |
| 2010/0090731 A1 | 4/2010 | Casagrande |
| 2010/0164761 A1 | 7/2010 | Wan et al. |
| 2010/0194483 A1 | 8/2010 | Storaska et al. |
| 2010/0240323 A1 | 9/2010 | Qiao et al. |
| 2010/0323643 A1 | 12/2010 | Ridgers |
| 2011/0006936 A1 | 1/2011 | Lin et al. |
| 2011/0032013 A1 | 2/2011 | Nelson et al. |
| 2011/0095784 A1 | 4/2011 | Behel et al. |
| 2011/0234204 A1 | 9/2011 | Tamura et al. |
| 2011/0234433 A1 | 9/2011 | Aruga et al. |
| 2011/0285575 A1 | 11/2011 | Landez et al. |
| 2011/0304490 A1 | 12/2011 | Janakiraman |
| 2012/0013406 A1 | 1/2012 | Zhu et al. |
| 2012/0161829 A1 | 6/2012 | Fernald |
| 2012/0200330 A1 | 8/2012 | Kawagoe et al. |
| 2012/0249207 A1* | 10/2012 | Natsume .................. G06F 1/08 327/293 |
| 2012/0262315 A1 | 10/2012 | Kapusta et al. |
| 2012/0297231 A1 | 11/2012 | Qawami et al. |
| 2012/0317365 A1 | 12/2012 | Elhamias |
| 2012/0328052 A1 | 12/2012 | Etemadi et al. |
| 2013/0002467 A1 | 1/2013 | Wang |
| 2013/0162454 A1 | 6/2013 | Lin |
| 2013/0194115 A1 | 8/2013 | Wu et al. |
| 2013/0211758 A1 | 8/2013 | Prathapan et al. |
| 2013/0300455 A1 | 11/2013 | Thirugnanam et al. |
| 2014/0029646 A1 | 1/2014 | Foxcroft et al. |
| 2014/0210532 A1 | 7/2014 | Jenkins |
| 2014/0327478 A1 | 11/2014 | Horng et al. |
| 2014/0347941 A1 | 11/2014 | Jose et al. |
| 2015/0162921 A1 | 6/2015 | Chen et al. |
| 2015/0180594 A1 | 6/2015 | Chakraborty et al. |
| 2015/0200649 A1 | 7/2015 | Trager et al. |
| 2015/0213873 A1 | 7/2015 | Joo |
| 2016/0084895 A1 | 3/2016 | Imhof |
| 2016/0119118 A1 | 4/2016 | Shokrollahi |
| 2016/0162426 A1 | 6/2016 | Benjamin et al. |
| 2016/0211929 A1 | 7/2016 | Holden et al. |

OTHER PUBLICATIONS

"NB3W1200L: 3.3 V 100/133 MHz Differential 1:12 Push-Pull Clock ZDB/Fanout Buffer for PCIe", ON Semiconductor, http://onsemi.com, Aug. 2013, Rev. 0, 26 Pages.

Avramov, et al., "1.5-GHz Voltage Controlled Oscillator with 3% Tuning Bandwidth Using a Two-Pole DSBAR Filter", Ultrasonics, Ferroelectrics and Frequency Control. IEEE Transactions on. vol. 58., May 2011, pp. 916-923.

Hwang, et al., "A Digitally Controlled Phase-Locked Loop with a Digital Ohase-Frequency Detector for Fast Acquisition", IEEE Journal of Solid State Circuits, vol. 36, No. 10, Oct. 2001, pp. 1574-1581.

Kratyuk, et al., "Frequency Detector for Fast Frequency Lock of Digital PLLs", Electronic Letters, vol. 43, No. 1, Jan. 4, 2007, pp. 1-2.

Mansuri, "Fast Frequency Acquisition Phase—Frequency Detectors for GSamples/s Phase-Locked Loops", IEEE Journal of Solid-State Circuits, vol. 37 No. 10, Oct. 2002, pp. 1331-1334.

Nagaraju, "A Low Noise 1.5GHz VCO with a 3.75% Tuning Range Using Coupled FBAR's", IEEE International Ultrasonics Symposium (IUS), Oct. 2012, pp. 1-4.

Watanabe, "An All-Digital PLL for Frequency Multiplication by 4 to 1022 with Seven-Cycle Lock Time", IEEE Journal of Solid-State Circuits, vol. 39 No. 2, Feb. 2003, pp. 198-204.

Texas Instruments "CDCEx913 Programmable 1-PLL VCXO Clock Synthesizer With 1.8-V, 2.5-V, and 3.3-V Outputs", Apr. 2015, pp. 1-36, pp. 11, 20-22.

\* cited by examiner

DUAL MODE CLOCK USING A COMMON RESONATOR AND ASSOCIATED METHOD OF USE

BACKGROUND OF THE INVENTION

Most modern systems have well defined operating states, or modes of operation and most of these systems use one or more clocks. Typical high performance applications are locked to a crystal oscillator operating between 1 MHz to 100 MHz, which helps to perform important internal operations of the chip with low jitter and least timing uncertainty. However, in many systems, particularly those that are portable, when these high performance operations are not active, the system is said to be in a low power state or low power mode, when power saving is much more critical for overall battery life. Some systems may even have more than two such operating modes or states. Since the logic power consumption is directly proportional to the clock frequency, most systems use less than 100 KHz for low power time keeping operations, when the device is operating in a low power mode. It is desirable to shut down all system functionality when the device is operating in a low power state. Power reduction benefits are higher if even the crystal oscillator generating the main system clock in MHz range can be shut down while still maintaining a low power kHz oscillator to keep time and to permit the system to resume from a sleep state. Crystal oscillators, utilizing crystal resonators, are commonly used to provide the MHz and kHz frequency clock signals when frequency stability is important. In most modern systems, a MHz oscillator commonly supports a high performance clock generator and in many systems, while many circuits can be powered down to reduce the power consumption of the circuit, long and PVT (process, voltage, temperature) dependent, widely varying startup times prohibit powering down the MHz crystal oscillator particularly, if the time spent in low power mode is relatively short. The kHz time keeping oscillator consumes low currents, but its low power (and hence limited gain) and high quality factor (Q) result in even longer startup times, which may not be acceptable in certain systems. Additionally, a 32.768 kHz frequency is typically used for the low power kHz oscillator, mainly due to the legacy reasons and thus the affordability of the crystal, however, some systems may prefer different frequencies. For example, while a 32.768 kHz frequency clock is convenient when a traditional legacy real-time system clock timer is needed, many modern systems don't need to generate this specific frequency, but still require a very accurate time-keeping circuit so that the system can wake up at a pre-calculated time, perform the required tasks and then return to a sleep state, without having to spend too much time, and hence power, synchronizing and starting up the MHz oscillator. In addition, some systems also require time keeping frequencies different from 32.768 kHz, in order to be able to better synchronize with other main logic circuits, which may not be running at an integer multiple of the 32.768 kHz clock. Some examples are 32 kHz, 50 kHz or 100 kHz.

In the prior art, when generating a high performance MHz clock and a low power time keeping kHz clock, two different crystal resonators are used, one for the high performance MHz clock and one for the low power kHz clock. The use of two separate resonators and their respective load tuning capacitors consumes a considerable amount of board space and increases the bill of material cost of the device. It is obvious that since the two different resonators at two different frequencies are used in these two different oscillators, their frequencies and phases may vary randomly over time, with respect to each other, further underscoring the synchronization difficulties in such systems between different clock domains.

Accordingly, what is needed in the art is a system and method for generating both a high performance clock signal and a low power clock signal which provides a reduction in area and in cost of the device (system), while providing increased flexibility in the circuit design utilizing the system providing the clock signals.

SUMMARY

The present invention describes a system and method for generating both a high performance clock signal and a low power clock signal which provides a reduction in area and in cost of the device, while enabling low power modes and providing increased flexibility in the system implementation through flexible low power, low frequency clock generation. A single resonator is used to generate both frequencies and the shift register based state machine is used to control the switchover of the resonator between the two oscillators, consuming negligible power. The low power, low frequency clock is always present as it is derived from the same resonator, even when the low power oscillator is disabled. The high performance clock can be shut down when the system goes into a low power state. The mode or state is controlled with the help of a single logic control line. This scheme uses the inertia of the high Q resonator to do a break-before-make switchover. The low power oscillator is disconnected to prevent the noise from low power circuits entering the high performance oscillator. The common resonator is always driven, either by the high performance oscillator or the low power oscillator. The low power clock is always available. The programmable divider, generating the final low frequency for the low power clock, can be programmed on-the-fly to slightly different divide ratios, through internal memory, to further enhance the accuracy of low power clock either to compensate for the reduced crystal resonator tuning capacitors or temperature, or both.

In one embodiment, an integrated circuit for a dual mode clock output signal is provided, which includes a resonator, a first clock circuit having a first oscillator circuit coupled to the resonator, the first clock circuit for generating a first clock signal having a first frequency in response to the resonator and a second clock circuit having a second oscillator circuit coupled to the same resonator and a programmable frequency divider, the second clock circuit for generating a second clock signal having a second frequency derived from the same resonator, wherein the second frequency of the second clock signal is determined by the programmable frequency divider. The integrated circuit further includes, a clock mode control circuit coupled to the first clock circuit and the second clock circuit, the clock mode control circuit for gradually switching the resonator between the first clock circuit and the second clock circuit.

In a particular embodiment of the integrated circuit providing a dual mode clock, resonator is a MHz resonator, the first frequency of the first clock signal is a MHz frequency clock signal and the second frequency of the second clock signal is a KHz frequency clock signal. In a particular embodiment, the resonator is a 25 MHz resonator, the first frequency of the first clock signal is 25 MHz and the second frequency of the second clock signal is 32.768 kHZ. In different embodiments, the 25 MHz clock frequency can be replaced by any other frequency, depending on the availability of a suitable crystal resonator called a MHz frequency. And the 32.768 KHz frequency can be similarly changed using the programmable frequency divider, called a KHz frequency.

In an additional embodiment, an integrated circuit providing a dual mode clock output signal includes a resonator, a high performance clock circuit having an inverting amplifier based oscillator circuit, the high performance clock circuit for generating a high performance clock signal having a first frequency in response to the resonator and a low power clock circuit having a current starved amplifier based oscillator circuit and a programmable frequency divider, the second clock circuit for generating a second clock signal having a second frequency derived from the same resonator, wherein the second frequency of the second clock signal is different than the first frequency of the first clock signal, which is accomplished using a special low power programmable fractional frequency divider. The integrated circuit includes a clock mode control circuit coupled to the first clock circuit and the second clock circuit, for gradually switching the resonator between the first oscillator circuit and the second oscillator circuit.

In accordance with another embodiment, a method of generating a dual mode clock output signal is provided, which includes, coupling a resonator to a first oscillator circuit of a first clock circuit, the first clock circuit for generating a first clock signal having a first frequency in response to the resonator and coupling the resonator to a second oscillator circuit of a second clock circuit, the second clock circuit for generating a second clock signal having a second frequency in response to the resonator, wherein the second frequency of the second clock signal is determined by a programmable frequency divider of the second clock circuit. The method further includes, coupling a clock mode control circuit to the first clock circuit and the second clock circuit and operating the clock mode control circuit to gradually switch the resonator between the first oscillator circuit and the second oscillator circuit.

In accordance with the present invention a dual mode clock circuit is described which provides both a high performance clock signal and a low power clock signal utilizing a common resonator. The ability to use a common resonator to generate two independent clock signals reduces the die area and the cost of the device without increasing the complexity of the integrated circuit and also results in significant reduction in the board space and BOM (bill of material) cost while ensuring that the power consumption in the low power state is significantly small.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
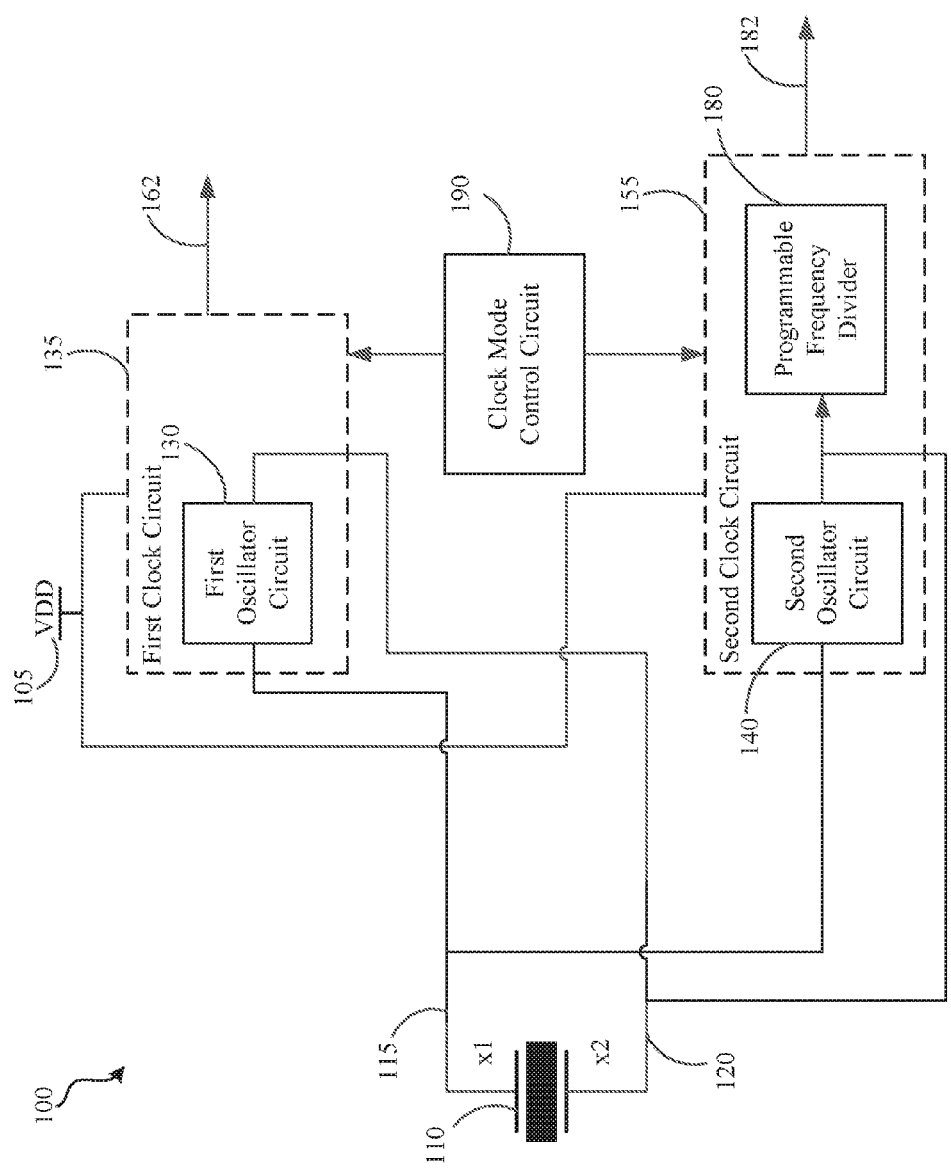
FIG. 1 is a block diagram of a dual mode clock using a common resonator, in accordance with an embodiment of the present invention.

Representative embodiments of the present invention are described below with reference to various examples wherein like reference numerals are used throughout the description and several view of the drawings to indicate like or corresponding parts and further wherein the various elements are not necessarily drawn to scale.

With reference to FIG. 1, an integrated circuit according to an embodiment of the present invention is illustrated and generally designated 100. In this exemplary embodiment 100, the present invention includes a resonator 110 having a resonant frequency that is presented across the outputs x1 115 and x2 120 of the resonator 110. In one embodiment, the resonator 110 may be a piezoelectric resonator, such as a crystal (quartz) resonator. Quartz resonators are well known in the art to provide a stable reference frequency for an integrated circuit. However, this is not meant to be limiting and the resonator may be one of various other resonators known in the art for generating a resonant signal to provide a reference frequency for the integrated circuit. The resonator 110 may be positioned on the printed circuit board or alternatively, on the integrated circuit itself. In a particular embodiment, the resonator 110 may be a crystal resonator having a resonant frequency in the MHz range.

As illustrated in FIG. 1, a first terminal 115 of the resonator 110 is coupled to an input of a first oscillator circuit 130 of a first clock circuit 135 and to an input of a second oscillator circuit 140 of a second clock circuit 155. A second terminal 120 of the resonator 120 is coupled to an output of the first oscillator circuit 130 and to an output of the second oscillator circuit 140. The second clock circuit 155 further comprises a programmable frequency divider 180 coupled to the output of the second oscillator circuit 140. In this embodiment, an input supply voltage VDD 105 is provided to the first clock circuit 135 and the second clock circuit 155. In this configuration, the first clock circuit 135 generates a first clock signal 162 having a first frequency in response to the resonator 110 and the second clock circuit 155 generates a second clock signal 182 having a second frequency in response to the resonator 110, and the second frequency of the second clock signal 182 is determined by the programmable frequency divider 180.

While the resonator 110 is physically coupled to both the first clock circuit 135 and the second clock circuit 155, the resonator is only connected to either the first oscillator circuit 130 of the first clock circuit 135 or the second oscillator circuit 140 of the second clock circuit 155 at a specific point in time, as such, one of the oscillator circuits must stop driving the resonator before connecting the other clock circuit to the resonator 110. The inertia of the resonator ensures the clock output during the switchover between the oscillator circuits, while a well designed state-machine ensures that there are no glitches on the clock signal output. In order to disconnect and connect the oscillator circuits to the resonator 110, as required to provide the output clock signal, the first clock circuit 135 and the second clock circuit 155 are coupled to a clock mode control circuit 190. The clock mode control circuit 190 gradually disconnects one of the oscillators from the resonator and gradually connects the other oscillator to drive the resonator. The clock mode control circuit 190 thereby allows the resonator to go back and forth between the first oscillator circuit 130 and the second oscillator circuit 140 as necessary for the dual mode operation of the integrated circuit.

In one embodiment of the present invention, the first clock circuit 135 is designed as a high performance clock circuit and the second clock circuit 155 is designed as a low power clock circuit. It is commonly known in the art that a high performance clock circuit provides an output clock signal having maximum swing, fast startup time, low phase noise and low jitter at the expense of reasonably large enough power consumption. Typical modern systems are designed such that the jitter sensitive operations are not performed using the low power clock. The high performance clock circuit typically provides a much higher frequency clock signal than the low power clock. In a particular embodiment, the high performance clock circuit provides a clock signal in the MHz range and a low power clock circuit provides a clock signal in the kHz range. In the present invention, a dual mode clock signal is provided, wherein the first clock circuit 135 and the second clock circuit 155 are individually optimized to provide the desired clock output signal while meeting either the high performance or low power operating requirements. For two different circuits, that are independently optimized for conflicting performance specifications, it is well known in the state of the art that the circuit topologies of these two oscillators must be different. It is thus understood that the common mode operating point of the resonator is significantly different in these two operating modes, making it very challenging to switch the resonator between these two modes without any glitches. The clock mode control circuit 190 of the present invention uses two independent shift register based state machines to provide for gradual switching of the resonator between the two oscillators circuits as well as for gradually engaging the crystal load tuning capacitors of the high performance oscillator 130, when the high performance oscillator is connected to the resonator.

Figure 2:
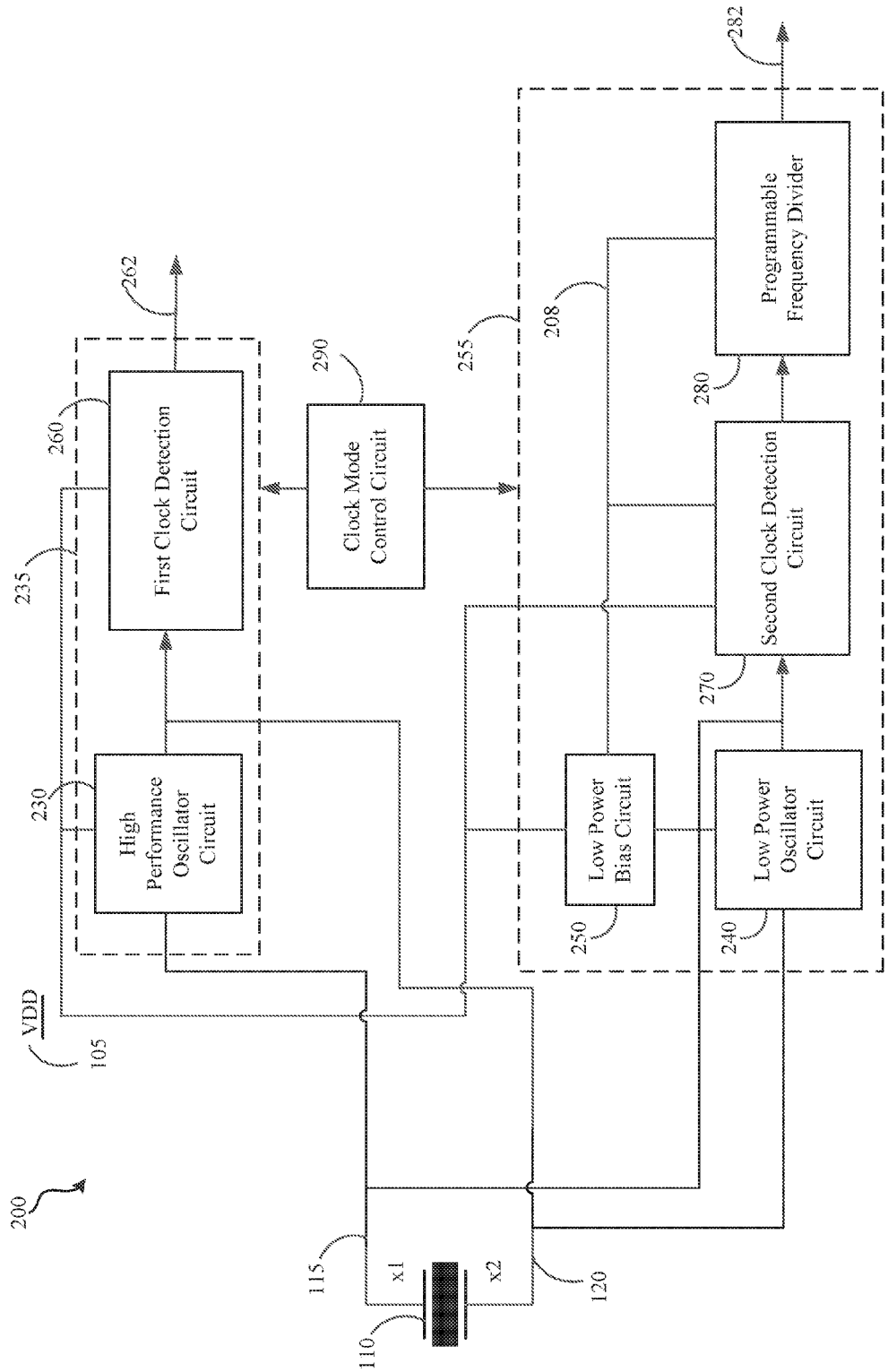
FIG. 2 is a block diagram of a high performance clock and a low power clock using a common resonator, in accordance with an embodiment of the present invention.

With reference to FIG. 2, in an exemplary embodiment of the integrated circuit 200 for generating a dual mode clock output signal, the first clock circuit 235 includes a high performance oscillator circuit coupled across the terminals 115, 120 of the resonator 110 and a first clock detection circuit 260 coupled to the output of the high performance oscillator circuit 230. Clock detection circuits are known in the art and commonly referred to as buffers and/or amplifiers. In general, the first clock detection circuit 260 generates a high performance output clock signal 262 from the sinusoidal output signal of the high performance oscillator circuit 230. In this embodiment, the second clock circuit 255 includes a low power oscillator circuit 240 coupled across the terminals 115, 120 of the resonator 110, a second clock detection circuit 270 coupled to an output of the low power oscillator circuit 240 and a programmable frequency divider 280 coupled to an output of the second clock detection circuit 270. A low power bias circuit 250 is coupled to the low power oscillator circuit 240, to provide the oscillator bias current, the second clock detection circuit 270, to provide the amplifier bias current and supply voltage for the second stage, and the programmable frequency divider 280 to provide a low voltage supply output 208 for the programmable frequency divider 280. The second clock detection circuit 270 generates a clock signal from the sinusoidal output of the low power oscillator 240 and the programmable frequency divider 280 divides the clock signal generated by the second clock detection circuit 270 to provide a low power output clock signal 282. In one embodiment, a plurality of bits are used to control the programmable frequency divider 280. In a particular embodiment of the invention, the resonator 110 may be a MHz crystal resonator, the first clock signal may be high performance MHz clock signal and the second clock signal may be low power kHz clock signal. The clock mode control circuit 290 coupled to the first clock circuit 235 and the second clock circuit 255 is then used to switch the resonator and associated tuning capacitors between the high performance oscillator circuit 230 and the low power oscillator circuit 240 as necessary for optimization of the system.

Figure 3:
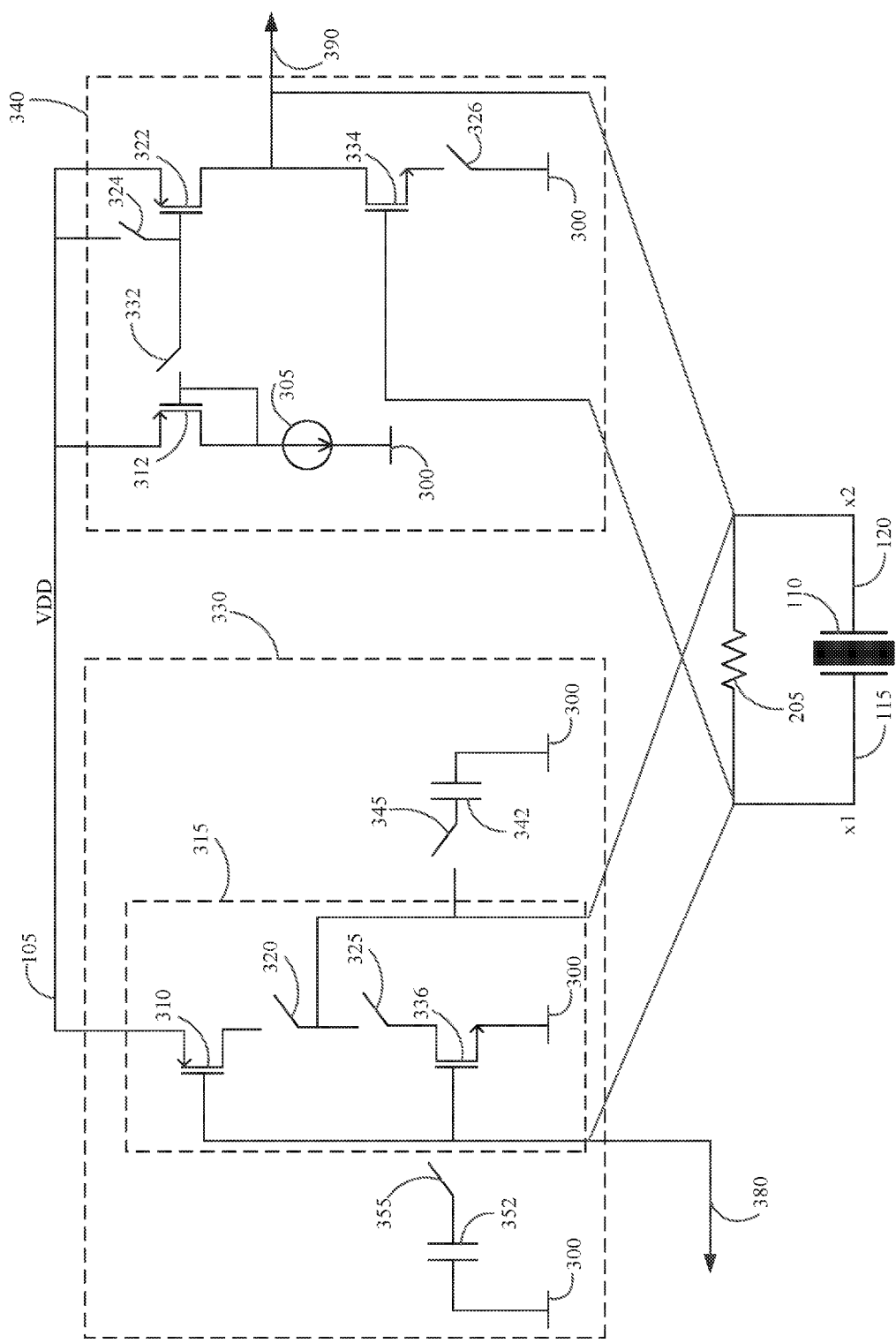
FIG. 3 is a schematic illustrating a high performance clock and a low power clock using common resonator, in accordance with an embodiment of the present invention.

With reference to FIG. 3, in an exemplary embodiment, the first oscillator circuit is a high performance oscillator circuit 330 providing a high performance, low jitter sinusoidal signal 380 to a first clock detection circuit and the second oscillator circuit is a low power oscillator circuit 340 providing a low power sinusoidal signal 390 to a second clock detection circuit. Both the high performance oscillator circuit 330 and the low power oscillator circuit 340 are coupled to a common resonator 110 and a bias resistor 205 is shared between the two oscillator circuits 330, 340 and is coupled across the terminals 115, 120 of the resonator 110. Sharing the bias resistor 205 between the high performance oscillator 330 and the low power oscillator 340 minimizes the layout area required for the dual mode clock. In an additional embodiment, the resistance value of the resistor may be optimized for each of the two oscillators.

In this exemplary embodiment, the high performance oscillator circuit 330 includes an inverting amplifier circuit 315 formed by an NMOS transistor 336 and a PMOS transistor 310. The inverting amplifier circuit 315 of the high performance oscillator circuit 330 maximizes the swing for any given supply voltage, compared to other oscillator circuit configurations known in the art, thus allowing the crystal oscillator to be optimized to achieve the highest performance in terms of lowest possible noise and lowest possible jitter, for a given supply voltage. The inverting amplifier circuit 315 is selectively coupled between a voltage source 105 and ground node 300 with the circuit further including a first switch 325 between the drain of the NMOS transistor 336 and one terminal 120 of the resonator 110 and a second switch 320 between the drain of the PMOS transistor 310 and the same terminal 120 of the resonator 110. With this circuit configuration, when directed by the clock mode control circuit, the high performance oscillator circuit 330 can be shut down, when the entire system, including this integrated circuit needs to achieve a low power state, by simultaneously opening the first switch 325 and the second switch 320 to disconnect the drains of the PMOS 310 and NMOS 336 transistors from the voltage supply rails and from the x2 terminal 120 of the resonator 110. The inverting amplifier circuit 315, including the switches 320, 325 can consist of multiple identical copies connected in parallel and controlled sequentially to gradually switch the dual mode clock from a high performance mode to a low power mode. When the high performance oscillator 330 is operating, a sinusoidal signal 380 is provided at the gates of the PMOS 310 and NMOS 336 transistors. The sinusoidal signal 380 is provided to a clock detection circuit to provide the high performance clock signal.

The high performance oscillator circuit 330 additionally includes two programmable on-chip crystal load tuning capacitors 342, 352. In the present invention, on-chip frequency tuning load capacitors are implemented such that the overall capacitance seen by the resonator 110 terminals 115, 120 can be lowered during low power operation of the clock. These on-chip capacitors are programmable to allow the use of different resonators as well as to allow for different layout designs of the circuitry. The first one of the programmable on-chip crystal load tuning capacitors 342 has a first terminal selectively coupled to the inverted amplifier circuit 315 by a switch 345 and a second terminal coupled to a ground node 300. A second one of the programmable on-chip crystal load tuning capacitors 352 has a first terminal selectively coupled to the inverted amplifier circuit 315 by a switch 355 and a second terminal coupled to a ground node 300. When initiated by the clock mode control circuit, the programmable on-chip crystal load tuning capacitors can be gradually coupled and decoupled to the terminals 115, 120 of the resonator 110 using the switches 345, 355. Switches 345, 355 each represent a plurality of switches in parallel controlled by a shift register and AND gate logic, that can be sequentially opened or closed to provide a gradual transition from no capacitance to full capacitance (coupled) or from full capacitance to no capacitance (decoupled).

In addition to the inverting amplifier based high performance clock circuit 330, the exemplary embodiment of the dual mode clock circuit of the present invention further includes a low power clock circuit 340 comprising a current starved amplifier to provide a low power sinusoidal signal 390 to a clock detector of the low power clock circuit. The current starved amplifier of the lower power oscillator is operable over a wide supply range and allows for conversion of a sinusoidal signal from the oscillator to a square-wave clock by a clock detection circuit to be accomplished with very low power consumption. The current starved amplifier comprises a first PMOS transistor 312 and a second PMOS transistor 322, wherein the gates of the PMOS transistors 312, 322 are coupled together to form a current mirror with a reference bias 305 coupled between the gate and the drain of the first PMOS transistor 312 and a ground node 300. An NMOS transistor 334, forming a common source transconductor, is coupled to the drain of the second PMOS transistor 322. In this configuration, the NMOS transistor 334 is in a diode configuration at DC. This structure keeps the swing of the oscillator sinusoidal signal 390 pinned near a diode drop above ground, thus making the clock detection more manageable with low power consumption. This sinusoidal signal 390 is generated at the drains of the PMOS transistor 322 and the NMOS transistor 334. This low power sinusoidal signal 390 is provided to a clock detection circuit to provide a low power clock signal for the dual mode clock circuit. The low power oscillator circuit 340 additionally includes a first switch 332 selectively coupled between the gates of the PMOS transistor 312, 322, a second switch 324 selectively coupled between the gate of one PMOS transistor 322 and the supply rail 105 and a third switch 326 selectively coupled between the source of the NMOS transistor 334 and a ground node 300. When directed by the clock mode control circuit, each of the switches 332, 324, 326 of the low power oscillator circuit 340 can be sequentially switched to gradually decouple the low power oscillator circuit from the resonator 110 to transition the dual mode clock circuit from a low power mode to a high performance mode. When the low power oscillator circuit 340 is operating to provide a low power clock signal, the programmable on-chip crystal load tuning capacitors 352, 342 and the drains of the PMOS 336 and PMOS 310 of the high performance oscillator 330 are disconnected from the terminals 115, 120 of the oscillator 110. In the low power state, the switches 320, 325, 355, 345, 324 are opened and switches 332 and 326 are closed.

With reference again to FIG. 2, when the high performance oscillator circuit 230 is coupled to the resonator 110, the high performance oscillator circuit 230 generates a high performance sinusoidal signal that is provided to a first clock detection circuit 260. The first clock detection circuit 260 generates a high performance clock signal 262, such as a square-wave high performance clock signal, from the high performance sinusoidal signal from the high performance oscillator circuit 230. Additionally, when the low power oscillator circuit 240 is coupled to the resonator, the low power oscillator circuit 240 generates a low power sinusoidal signal that is provided to a second clock detection circuit 270. The low power bias circuit 250 provides a low voltage supply output 208 to the second clock detection circuit 270 and the programmable frequency divider 280. The second clock detection circuit 270 generates a low power square wave that is provided to a programmable frequency divider 280 which generates a low power KHz clock 282. Because the low power oscillator circuit 240 has a low voltage sinusoidal signal, the second clock detection circuit 270 must also be designed as a low voltage clock detection circuit.

Figure 4:
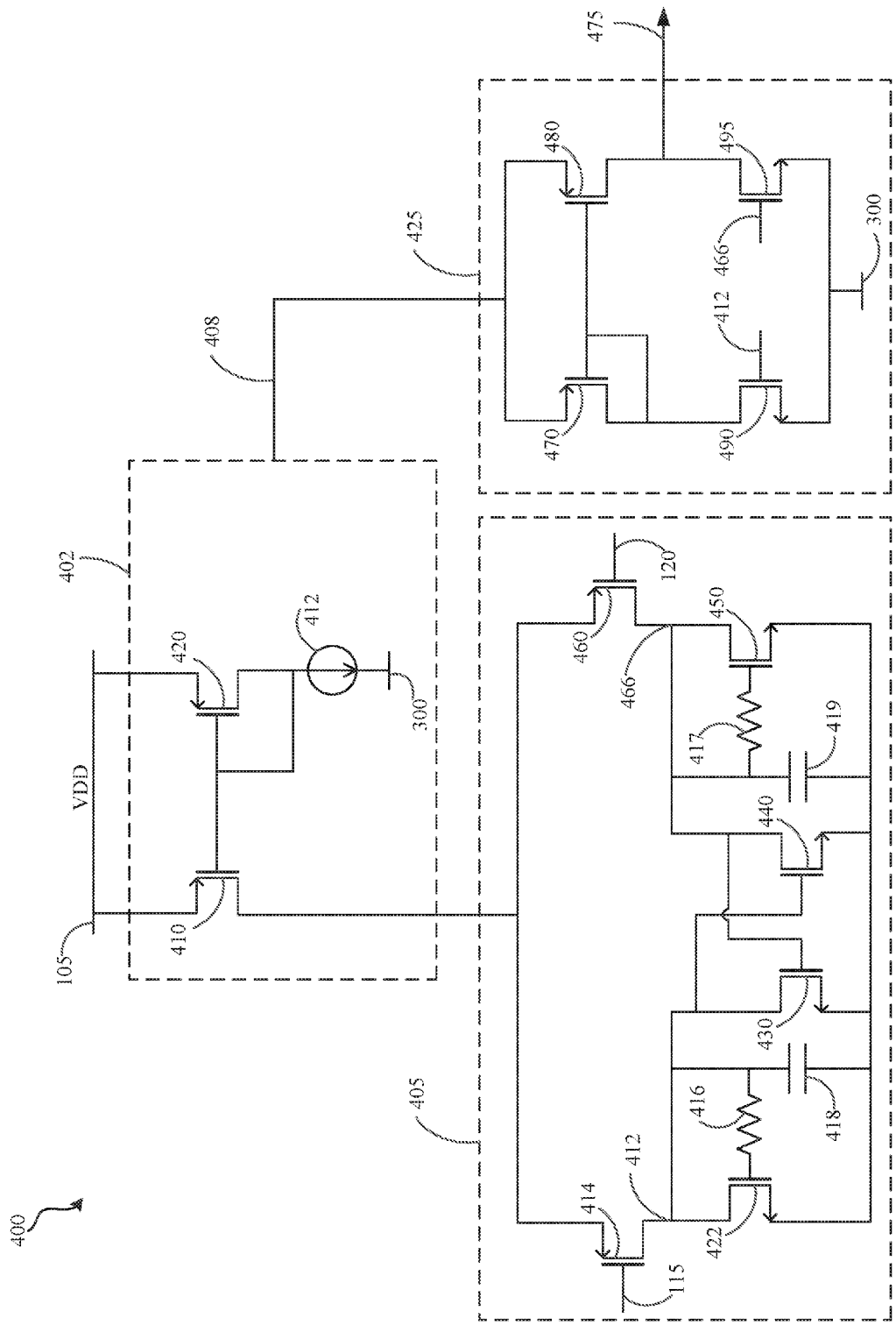
FIG. 4 is a schematic illustrating a low power clock detection circuit, in accordance with an embodiment of the present invention.

With reference to FIG. 4, in one embodiment the second clock detection circuit 270 is designed as a low power clock detection circuit 400 comprising a low power bias circuit 402, a first stage amplifier 405 and a second stage amplifier 425. In this embodiment, the low power bias circuit 402 includes a current mirror formed by two PMOS transistors 410, 420 and a reference bias 412 coupled between the gates of the PMOS transistors 410, 420 and a ground node 300. The low voltage supply output 408 of the low power bias circuit 402 is provided to the second stage amplifier 425, ensuring that its rail-to-rail output swing matches with that of the following programmable divider which also runs from the same supply voltage. The first stage amplifier 405 includes a first transconductor, PMOS transistor 414, having a gate coupled to a first terminal 115 of the resonator and a second transconductor, PMOS transistor 460, having a gate coupled to a second terminal 120 of the resonator. The PMOS input pair 414, 460 are selected for their ability to interface well with the low voltage oscillator circuit topology. The first transconductor, transistor 414, drives a first inductive load formed by an NMOS transistor 422 having a resistor 416 and capacitor 418 coupled to its gate. The second transconductor, transistor 460, drives a second inductive load formed by an NMOS transistor 450 having a resistor 417 and a capacitor 419 coupled to its gate. Two NMOS transistors 430, 440 form a latch between the first inductive load and the second inductive load and provides some negative resistance to the nodes 412 and 466. The outputs 412, 466 of the first amplifier stage 405 are provided to the second amplifier stage 425. The second amplifier stage 425 comprises two pairs of PMOS/NMOS transistors 470, 480, 490, 495 configured to amplify the signal provided by the first amplifier stage 405. Because the second stage amplifier 425 is powered by the low power bias circuit 402, the slewing requirements are relaxed to achieve the rail-to-rail swing to the low voltage logic supply output 408. This exemplary low power clock detection circuit 400 generates a low power clock signal 475 from the low power sinusoidal signal generated by the low power oscillator circuit. The low voltage logic supply output 408 is also used by the programmable frequency divider 280, and thus the low power clock signal 475 has a full swing which can correctly drive the programmable frequency divider 280.

Figure 5:
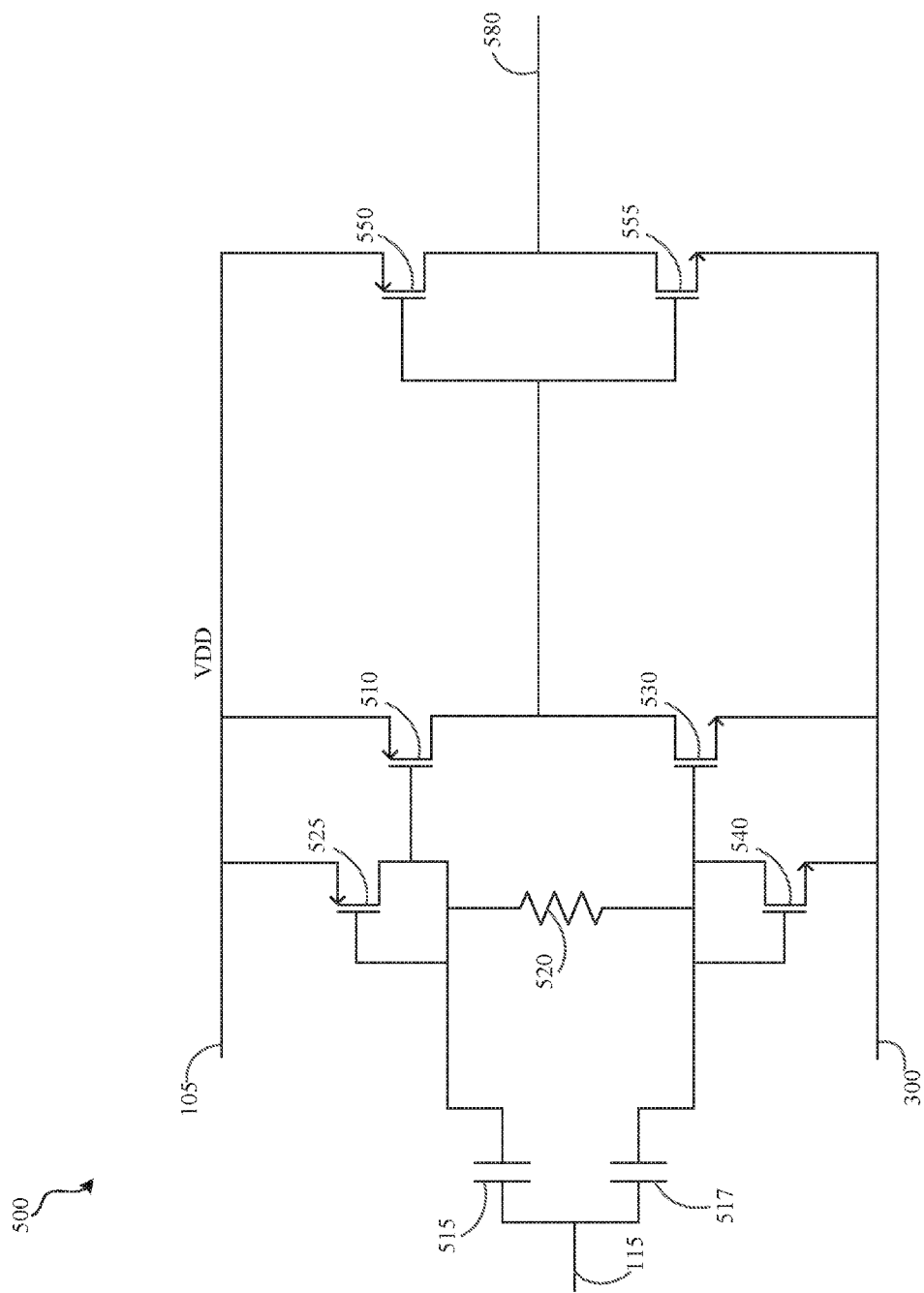
FIG. 5 is a schematic illustrating an alternative low power clock detection circuit, in accordance with an embodiment of the present invention.

As shown with reference to FIG. 5, in an alternative embodiment, the second clock detection circuit of the low power oscillator circuit may be provided by a low power clock detection circuit that provides a wider frequency range 500. In this embodiment, capacitive coupling at the terminal 115 of the resonator is provided by capacitors 515, 517. A pair of PMOS/NMOS bias transistors 525, 540 are used to separately bias the gates of a first inverter formed by a pair of PMOS/NMOS transistors 510, 530. The PMOS/NMOS bias transistor pair 525, 540 are used to bias the gates of the inverter pair of PMOS/NMOS transistors 510, 530 close to the supply rails 105, 300 and a bias resistor 520 ensures that the inverter pair of PMOS/NMOS transistors 510, 530 have their gates biased more towards the threshold voltage (Vth) and less towards the supply rails, to insure that both devices are slightly on in order to handle the MHz frequency input while still consuming very low power. The size of the inverter pair of PMOS/NMOS transistors 525, 520 and the bias resistor 540 is optimized considering that, if the transistors are biased to operate too close to the supply rail and too far below Vth, the following inverter will not have enough gain for the lower clock swing. In contrast, if the gates are biased too far away from supply rails and too far above Vth, the resulting power consumption will be too high. A second inverter formed by PMOS transistor 550 and NMOS transistor 555 sharpens the edge rate and provide a rail to rail voltage swing at the output node 580. In this exemplary embodiment of a low power clock detection circuit 500, a low power clock signal is provided over a wider range of resonant frequencies of the resonator enabling a single silicon design to support a wide range of crystal frequencies.

With reference again to FIG. 2, the low power clock signal generated by the second clock detection circuit 270 is provided to a programmable frequency divider 280. The frequency of the clock signal generated by the second clock detection circuit 270 is dependent upon the frequency of the resonator 110. The programmable frequency divider 280 receives the clock signal from the second clock detection circuit 270 at the resonant frequency of the resonator 110 and provides a low power frequency divided clock signal at the desired frequency. For example, the resonator 110 may operate in the MHz range and the low power clock signal 282 generated by the programmable frequency divider 280 low power clock circuit 255 may be in the kHz range.

Figure 6:
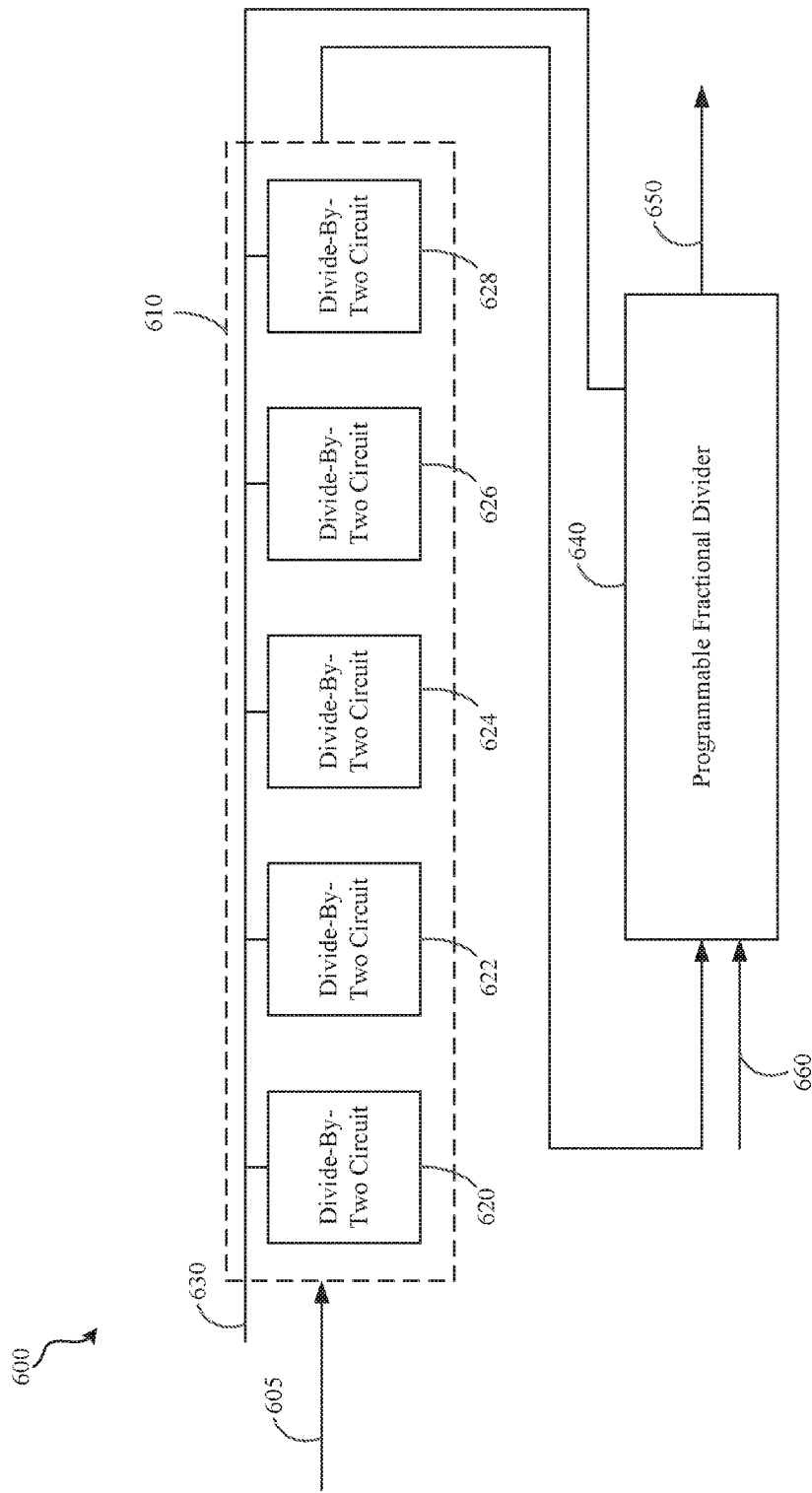
FIG. 6 is a block diagram illustrating a programmable frequency divider, in accordance with an embodiment of the present invention.

In order to provide a low power clock signal that is independent of the resonant frequency of the resonator, a programmable frequency divider is implemented in the low power clock circuit 255 of the present invention. FIG. 6 illustrates an exemplary embodiment of a programmable frequency divider 600 that can be implemented in the low power clock circuit 255 of the present invention. In this exemplary embodiment, the programmable frequency divider 600 includes an integer divider 610 in series with a programmable fractional divider 640. In operation, the integer divider 610 receives the clock signal 605 from the second clock detection circuit 270 and the programmable fractional divider 640 receives the output from the integer divider 610 and a digital word 660 and provides a low power clock signal 650. In one embodiment, the integer divider 610 may include a plurality of divide-by-two circuits 620, 622, 624, 626, 628 coupled to a low voltage supply 630 provided by a low power bias circuit. The low voltage supply 630 is the same supply as the low power clock detection circuit 500 or the last stage of the low power clock detection circuit 500 of FIG. 5, or 425 or FIG. 4, such that no level shifters are necessary at the interface of low power clock detection circuit 500/425 and integer divider 610. Each of the divide-by-two circuits 620, 622, 624, 626, 628 divides the low power clock signal 605 by two and provides the result to the next divide-by-two circuit. In this way, the frequency of a MHz clock signal 605 can be reduced by half following processing by each divide-by-two circuit 620, 622, 624, 626, 628, thus successively reducing the power by a factor of two upon each divide-by-two stage. In one embodiment, the integer divider 610 can be power optimized by utilizing a combination of divide-by-two circuits having different power requirements. For example, because the frequency of the clock signal 605 is highest when the signal enters the integer divider 610, the divide-by-two circuits at the beginning of the circuit 620, 622 may be using faster devices, having a slightly higher power consumption, and the remaining divide-by-two circuits 624, 626, 628 may be using slower devices, having reduced power consumption. The crystal resonator frequency largely defines the power consumption of the flip-flops in the initial stages of the integer divider 610. In a specific embodiment, the devices of the divide-by-two circuits can be a combination of 3.3V devices and 1.8V devices. In an exemplary embodiment, to support a wide range of crystal resonator frequencies, the divide-by-two circuit at the beginning of the circuit 620, 622 may use 1.8V devices (relatively lower Vth and smaller channel lengths for higher speed), powered by 1.2V internal rail, whereas all the following stages may use 3.3V devices (relatively higher Vth and longer channel lengths for lower power), powered by 1.2V internal rail. After the frequency of the low power clock signal has been reduced by the integer divider 610, the low power clock signal is provided to the programmable fractional divider 640. In one embodiment the programmable fractional divider 640 is a low power programmable fractional divider using 3.3V devices, but the devices are operated by a 1.2V supply voltage. The fractional frequency divider 640 may comprise a dual modulus divider to provide a factional division ratio (N/N+1) coupled to an accumulator to provide a clock signal 650 that is a fraction of the resonant frequency of the resonator. The fractional frequency divider 640 can adjust for loss of accuracy due to reduced on-chip load capacitors by adjusting the fractional division ratio, which is provided by a digital word stored in memory. The fractional frequency divider 640 may also provide on-the-fly adjustments to the low power clock 650 for additional frequency accuracy. In an exemplary embodiment, a temperature profile of the crystal resonator can be corrected by storing the fractional division ratio words in a memory to compensate for both cases, with and without the crystal load tuning capacitors. Additionally, the carry-out from the accumulator of the programmable fractional divider 640 is a much slower clock sequence that can also be used as a slow auxiliary clock signal. As such, the integer divider 610 in combination with the programmable fractional divider 640 and a digital word 660 can generate a low power clock signal 650 at a plurality of low power output frequencies from a given single resonator. And also a single design can support multiple different resonant frequencies to generate multiple low power output clock frequencies Referring again to FIG. 3, the terminals 115, 120 of the resonator 110 are physically coupled to both the high performance clock circuit 330 and the low power clock circuit 340. However, the resonator 110 is driven only by either the high performance oscillator circuit 330 or the low power oscillator circuit 340 at one point in time. Fast switchover between the high performance clock circuit 330 and the low power clock circuit 340 will disrupt the continuity of the signal on the resonator, therefore the switches of the high performance oscillator circuit 330 and the low power oscillator circuit 340 are used to gradually transition the resonator 110 between the two clock circuits. The present invention takes advantage of the inertia of the high Q resonator 110 when transitioning between the high performance oscillator circuit 330 and the low power oscillator circuit 340.

Figure 7:
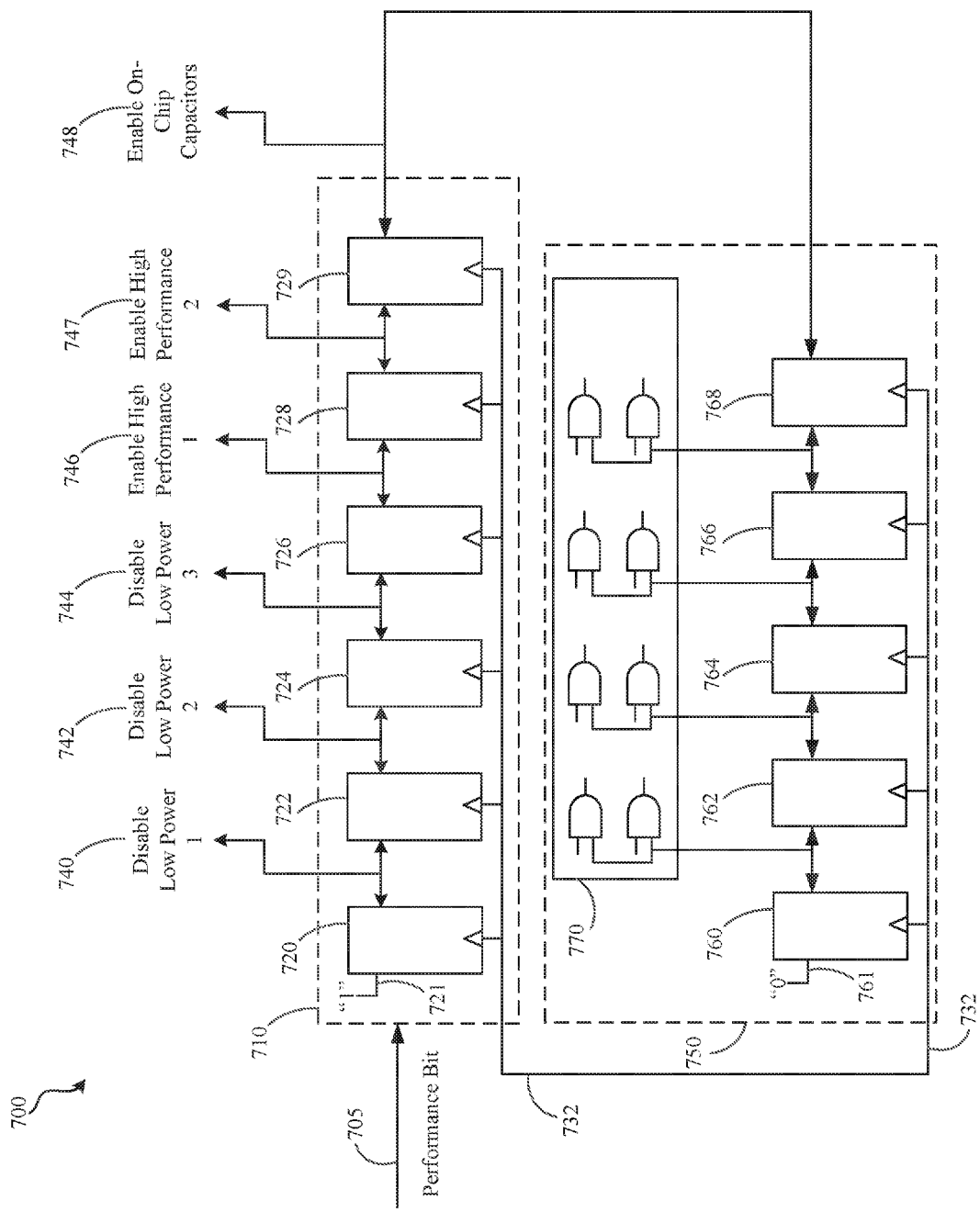
FIG. 7 is a schematic illustrating a register based state machine, in accordance with an embodiment of the present invention.

With reference to FIG. 7, in order to take advantage of the inertia of the resonator to transition between a high performance clock and a low power clock, the present invention utilizes a shift register based state machine 700. The shift register based state machine 700 may include a first shift register 710 in series with a second shift register 750. In one embodiment the first shift register 710 is a right/left shift register that can shift a bit in either direction through the individual shift registers 720, 722, 724, 726, 728, 729. A clock signal 732 is provided to each of the individual shift registers 720, 722, 724, 726, 728, 729 to shift a performance bit 705 through the individual registers 720, 722, 724, 726, 728, 729. In a particular embodiment, the performance bit 705, received at the first shift register 710 and the second shift register 750, specifies either a high performance clock mode (performance bit=1) or a low power clock mode (performance bit=0). In this embodiment, individual shift register 720 has a logic 1 as its input 721. The performance bit specifies the bi-directional shift registers to right-shift the logic 1 at register 720's input through the successive shift register stages 720, 722, 724, 726, 728, 729, 768, 766, 764, 762, 760 if performance bit=1 or left-shift the logic 0 at register 760's input 761 through the successive shift register stages 760, 762, 764, 766, 768, 729, 728, 726, 724, 722, 720 if performance bit=0. Referring again to FIG. 3, the low power clock circuit 340 includes three switches 332, 324, 326 for selectively coupling the devices of the circuit to the supply rails. As such, a first switch 332 of the low power clock circuit 340 may be associated with the Disable Low Power 1 register 740 of a first individual shift register 720, a second switch 324 may be associated with the Disable Low Power 2 register 742 of a second individual shift register 722 and a third switch 326 may be associated with the Disable Low Power 3 register 744 of a third individual shift register 724. Additionally, the high performance circuit may include a first switch 320 associated with the Enable High Performance 1 register 746 of a fourth individual shift register 726 and a second switch 325 associated with the Enable High Performance 2 register 747 of a fifth individual shift register 728. The Enable On-Chip Capacitors register 748 associated with a sixth individual shift register 729 may provide the input to the second shift register 750. The second shift register 750 is responsible for controlling the capacitance of the programmable on-chip crystal load tuning capacitors 352, 342 of FIG. 3. As illustrated, the second shift register 750 may comprise a plurality of individual shift registers 760, 762, 764 766, 768 driven by a clock signal 732. The outputs of the individual shift registers 760, 762, 764 766, 768 are coupled to a series of AND gates 770 that function to simultaneously introduce capacitance across the resonator utilizing the programmable on-chip crystal load tuning capacitors 352, 342. For example, a first individual register 768 may provide a signal to add 5 pF of load capacitance and a second individual register 766 may add another 5 pF in the next clock cycle, thereby providing 10 pF of total load capacitance across the resonator. In general, the on-chip programmable load capacitor can be implemented as a bank of small capacitances which are switched into and out of operation by the state machine 700. The number of individual shift registers in the second shift register 750 may be increased to provide a higher resolution capacitor transition.

In transitioning from a low power clock mode to a high performance clock mode, if the resonator were abruptly disconnected from the low power clock circuit and connected directly to the high performance clock circuit, the resonator would stop resonating during the transition time. However, in the present invention, when a performance bit 705 indicates a transition from a low power clock mode to a high performance clock mode, the registers of the first state machine 710 function to sequentially disconnect the low power clock circuit in three stages utilizing the three switches and then sequentially connect the high performance clock circuit in two stages using the four switches of the high performance clock circuit. The on-chip programmable load capacitance is the gradually introduce into the circuit. In the present invention, the resonator continues to resonate during the transition through the gradual introduction and removal of elements of the circuit. As such, a smooth transition between the low power clock mode and the high performance clock mode is realized without any missing clock pulse or any glitch on the resonator signal. In general, the shift register based state machine 700 utilizes the inertia of the resonator to smoothly transition between a high performance clock mode and a low power clock mode allowing a break-before-make mechanism. This scheme allows a simple state machine for controlling the operating mode and thus minimizes the power consumption overhead due to the state machine itself.

In an exemplary embodiment of the operation of the register based state machine 700 of the present invention, upon initial power up of the system, the high performance clock circuit starts up first and the state machine clock 732 is disabled until the high performance clock circuit reaches full power. At initial power up, individual registers 720, 722, 724, 726, 728 are set to logic 1 and individual registers 729, 768, 766, 764, 762, 760 are set to logic 0. As such, at initial power up, switches 332, 326, 355, 345 are open and switches 320, 325 324 are closed until full power is reached. After the initial power up of the system, the dual mode clock circuit switches between the wake-up state and high performance mode or between the wake-up state and low power mode based upon the value of the performance bit 705. If high performance clock mode is selected by the performance bit, the on-chip programmable load capacitors are gradually added to the circuit (shift register 700 will right-shift). When the performance bit indicates that the system should switch to a low power clock mode, (shift register 700 will left-shift) and the four switches of the high performance clock circuit are sequentially opened, as directed by the individual shift registers of the state machine 700, thereby disconnecting the high performance clock circuit from the resonator. Then the low power clock circuit is connected to the resonator by sequentially closing switches 332, 326 and opening switch 324 of the low power clock circuit, as indicated by the individual shift registers of the state machine 700. Additionally, when the performance bit 705 changes to a logic 1, indicating that the system should switch to a high performance clock mode, first the switches 332, 326 of the low power clock circuit are sequentially opened and 324 is closed to disable the low power clock circuit, then the switches of the high performance clock circuit are closed, followed by the gradual introduction of the load capacitance into the circuit. In addition to providing a smooth transition between the low power and high performance clock modes, the present invention also provides for a faster transition between clock modes, thereby further reducing the power requirements of the system and improving the battery life of the system. In prior art, the time for MHz oscillator to start from 0 is known to be long and PVT dependent, thereby discouraging the shutting down of the MHz oscillator, particularly when low power states last for relatively short periods of time. However, in the present invention, the MHz oscillation is always sustained, at a lower amplitude when in low power mode. During transition from a low power state to high power state, the transition time is very well defined by the high precision of the resonator itself.

Figure 8:
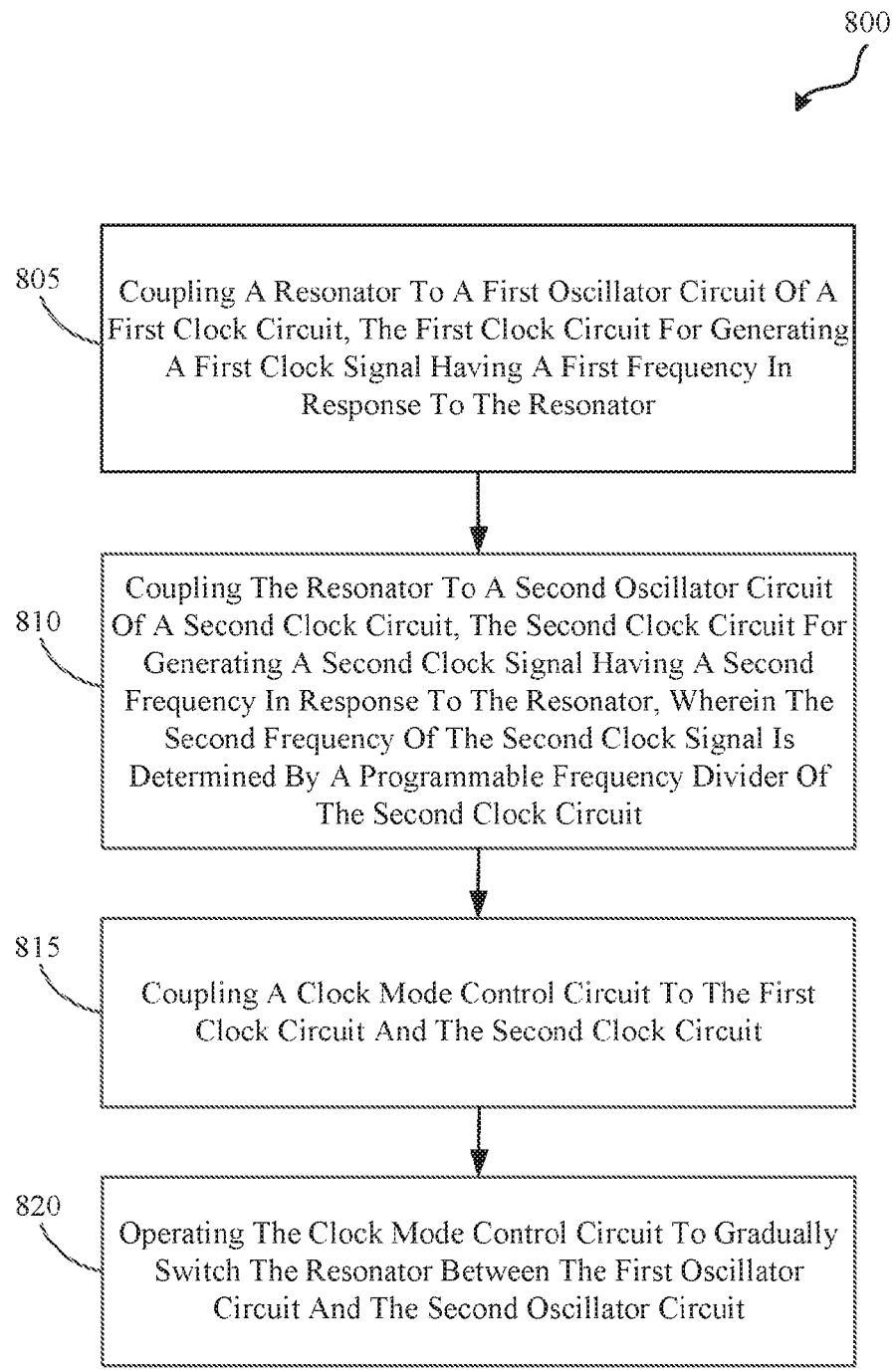
FIG. 8 is a flow diagram illustrating a method of providing a dual mode clock, in accordance with an embodiment of the present invention.

With reference to FIG. 8, in operation of the present invention, a method of generating a dual mode clock signal 800 includes, coupling a resonator to a first oscillator circuit of a first clock circuit, the first clock circuit for generating a first clock signal having a first frequency in response to the resonator 805. As illustrated in FIG. 1, in accordance with the method of the present invention, a resonator 110 is coupled to a first oscillator circuit 130 of a first clock circuit 135 to generate a first clock signal having a first frequency 162.

The method further includes, coupling the resonator to a second oscillator circuit of a second clock circuit, the second clock circuit for generating a second clock signal having a second frequency in response to the resonator, wherein the second frequency of the second clock signal is determined by a programmable frequency divider of the second clock circuit 810. As illustrated in FIG. 1, in accordance with the method of the present invention, the resonator 110 is coupled to a second oscillator circuit 140 of a second clock circuit 155 for generating a second clock signal having a second frequency 182, wherein the second frequency is determined by a programmable frequency divider 180.

The method further includes, coupling a clock mode control circuit to the first clock circuit and the second clock circuit 815 and operating the clock mode control circuit to gradually switch the resonator between the first oscillator circuit and the second oscillator circuit 820. Again with reference to FIG. 1, the clock mode control circuit 190 is coupled to the first clock circuit 135 and the second clock circuit 155 and the clock mode control circuit gradually switches the resonator between the first oscillator circuit 130 of the first clock circuit 135 and the second oscillator circuit 140 of the second clock circuit 155. As previously described, in a specific embodiment, the first oscillator circuit 130 may be a high performance clock circuit and the second clock oscillator circuit 140 may be a low power clock circuit.

The present invention provides a system whereby a common resonator can be used to generate two independent clock signals. One of the clock signals may be a high performance clock signal in the MHz range and another clock signal may be a low power clock signal in the kHz range. The ability to use a common resonator to generate two independent clock signals reduces the die area and the cost of the device without increasing the complexity of the integrated circuit and also reduces the BOM cost and board space. More specifically, in the present invention a low frequency resonator and the two on-chip capacitors of the low power resonator are essentially eliminated from the design.

Additionally, the high performance clock can be shut-off when it is not being used to save power, while the low power clock circuit continues to run. Utilizing a power sequencing circuit that takes advantage of the inertia of the resonator, an improved turn-on time of the high performance clock from a sleep state is realized, which reduces the overall power consumption of the system and is very desirable feature in low-power, low-energy systems where the system needs to toggle rapidly between the sleep state and the active state.

In addition, calibration of the oscillators is no longer necessary because both the high performance clock and the low power clock are operating based upon the same resonant frequency.

Exemplary embodiments of the invention have been described using CMOS technology. As would be appreciated by a person of ordinary skill in the art, a particular transistor can be replaced by various kinds of transistors with appropriate inversions of signals, orientations and/or voltages, as is necessary for the particular technology, without departing from the scope of the present invention.

In one embodiment, dual mode clock circuitry may be implemented in an integrated circuit as a single semiconductor die. Alternatively, the integrated circuit may include multiple semiconductor dies that are electrically coupled together such as, for example, a multi-chip module that is packaged in a single integrated circuit package.

In various embodiments, the system of the present invention may be implemented in a Field Programmable Gate Array (FPGA) or Application Specific Integrated Circuit (ASIC). As would be appreciated by one skilled in the art, various functions of circuit elements may also be implemented as processing steps in a software program. Such software may be employed in, for example, a digital signal processor, microcontroller or general-purpose computer.

For purposes of this description, it is understood that all circuit elements are powered from a voltage power domain and ground unless illustrated otherwise. Accordingly, all digital signals, except for the second stage amplifier 425 and the programmable frequency divider 280, generally have voltages that range from approximately ground potential to that of the power domain Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. An integrated circuit providing a dual mode clock output signal, the integrated circuit comprising:
    a resonator;
    a first clock circuit having a first oscillator circuit coupled to the resonator, the first clock circuit for generating a first clock signal having a first frequency in response to the resonator;
    a second clock circuit having a second oscillator circuit coupled to the resonator and a programmable frequency divider, the second clock circuit for generating a second clock signal having a second frequency in response to the resonator, wherein the second frequency of the second clock signal is determined by the programmable frequency divider; and
    a clock mode control circuit coupled to the first clock circuit and the second clock circuit, the clock mode control circuit for gradually switching the resonator between the first oscillator circuit and the second oscillator circuit to provide a dual mode clock output signal.

2. The integrated circuit of claim 1, wherein the resonator is a MHz resonant frequency, the first frequency of the first clock signal is a MHz frequency clock signal and the second frequency of the second clock signal is a KHz frequency clock signal.

3. The integrated circuit of claim 1, wherein the first frequency of the first clock signal is higher than the second frequency of the second clock signal.

4. The integrated circuit of claim 1, wherein the first oscillator circuit is a high performance oscillator circuit.

5. The integrated circuit of claim 1, wherein the second oscillator circuit is a low power oscillator circuit.

6. The integrated circuit of claim 1, wherein the first clock circuit further comprises a first clock detection circuit coupled to an output of the first oscillator circuit.

7. The integrated circuit of claim 6, wherein the second clock circuit further comprises a second clock detection circuit coupled to an output of the second oscillator circuit.

8. The integrated circuit of claim 7, wherein the second clock circuit further comprises a low power bias circuit coupled to the second oscillator circuit, the second clock detection circuit and the programmable frequency divider.

9. The integrated circuit of claim 1, further comprising a shared bias resistor coupled across the resonator.

10. The integrated circuit of claim 1, wherein the first oscillator circuit comprises an inverting amplifier.

11. The integrated circuit of claim 1, wherein the second oscillator circuit comprises a current starved amplifier.

12. The integrated circuit of claim 1, wherein the first oscillator circuit and the second oscillator circuit each comprise a plurality of switches and the clock mode control circuit further comprises a first shift register based state machine for controlling the plurality of switches to gradually switch the resonator between the first oscillator circuit and the second oscillator circuit.

13. The integrated circuit of claim 1, wherein the first oscillator circuit further comprises two programmable on-chip crystal load tuning capacitors and the clock mode control circuit further comprises a second shift register based state machine for gradually varying the two programmable on-chip crystal load tuning capacitors across the resonator.

14. An integrated circuit providing a dual mode clock output signal, the integrated circuit comprising;
a resonator having a resonant frequency;
a high performance clock circuit having an inverting amplifier based oscillator circuit, the high performance clock circuit for generating a first clock signal having a first frequency in response to the resonant frequency of the resonator;
a low power clock circuit having a current starved amplifier based oscillator circuit and a programmable frequency divider, the low power clock circuit for generating a second clock signal having a second frequency in response to the resonator, wherein the second frequency of the second clock signal is different than the first frequency of the first clock signal; and
a clock mode control circuit coupled to the high performance clock circuit and the low power clock circuit, the clock mode control circuit for gradually switching the resonator between the inverting amplifier based oscillator circuit and the current starved amplifier based oscillator circuit to provide a dual mode clock output signal.

15. A method of generating a dual mode clock output signal, the method comprising:
coupling a resonator to a first oscillator circuit of a first clock circuit, the first clock circuit for generating a first clock signal having a first frequency in response to the resonator;
coupling the resonator to a second oscillator circuit of a second clock circuit, the second clock circuit for generating a second clock signal having a second frequency in response to the resonator, wherein the second frequency of the second clock signal is determined by a programmable frequency divider of the second clock circuit;
coupling a clock mode control circuit to the first clock circuit and the second clock circuit; and
operating the clock mode control circuit to gradually switch the resonator between the first oscillator circuit and the second oscillator circuit to generate a dual mode clock output signal.

16. The method of claim 15, wherein the first clock circuit is a high performance clock circuit.

17. The method of claim 15, wherein the second clock circuit is a low power clock circuit.

18. The method of claim 15, wherein the first frequency of the first clock signal is higher than the second frequency of the second clock signal.

19. The method of claim 15, wherein the first oscillator circuit and the second oscillator circuit each comprise a plurality of switches and operating the clock mode control circuit to gradually switch the clock output signal between the first clock signal and the second clock signal further comprises, operating the clock mode control circuit to control the switches to gradually switch between the first oscillator circuit and the second oscillator circuit.

20. The method circuit of claim 15, wherein the first oscillator circuit further comprises two programmable on-chip crystal load tuning capacitors and operating the clock mode control circuit to gradually switch a clock output signal between the first clock signal and the second clock signal further comprises, operating the clock mode control circuit to gradually switch the two programmable on-chip crystal load tuning capacitors across the resonator.

* * * * *